(12) United States Patent
O'Keeffe

(10) Patent No.: US 7,362,143 B2
(45) Date of Patent: Apr. 22, 2008

(54) CIRCUIT AND METHOD FOR MONITORING A SUPPLY VOLTAGE AND PROVIDING AN INDICATION WHEN THE SUPPLY VOLTAGE FALLS BELOW A PREDETERMINED THRESHOLD

(75) Inventor: Daniel O'Keeffe, Whitechurch (IE)

(73) Assignee: Analog Devices, Inc., Norwood, MA (US)

( * ) Notice: Subject to any disclaimer, the term of this patent is extended or adjusted under 35 U.S.C. 154(b) by 208 days.

(21) Appl. No.: 11/299,997

(22) Filed: Dec. 9, 2005

(65) Prior Publication Data

US 2007/0132486 A1    Jun. 14, 2007

(51) Int. Cl.
*H03K 5/22* (2006.01)

(52) U.S. Cl. .......................... 327/77; 327/143

(58) Field of Classification Search ................. 327/50, 327/77, 142, 143, 530
See application file for complete search history.

(56) References Cited

U.S. PATENT DOCUMENTS 3,988,661 A * 10/1976 McCoy ........................ 363/16
6,259,612 B1 * 7/2001 Itoh ............................ 363/60

FOREIGN PATENT DOCUMENTS

JP            11133069 A  * 10/1997

* cited by examiner

*Primary Examiner*—Dinh T. Le
(74) *Attorney, Agent, or Firm*—Wolf, Greenfield & Sacks, P.C.

(57) ABSTRACT

A power supply monitoring circuit is provided that utilises an adaptive internal control of the refresh rates of capacitors to reduce the power requirements of the circuit. The circuit provides at an output a signal indicative of the level of the supply voltage relative to a predetermined reference voltage.

35 Claims, 6 Drawing Sheets

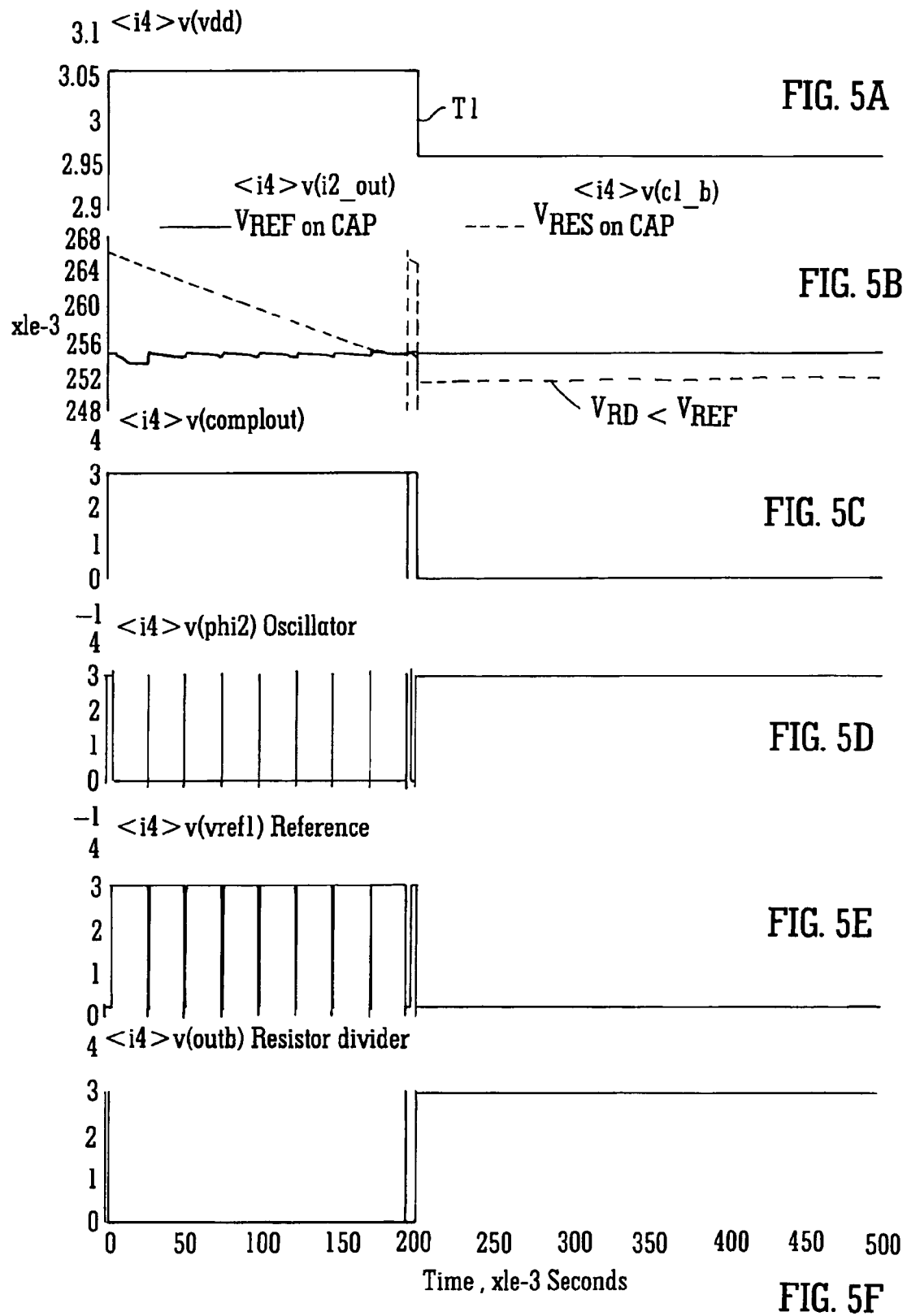

US 7,362,143 B2

CIRCUIT AND METHOD FOR MONITORING A SUPPLY VOLTAGE AND PROVIDING AN INDICATION WHEN THE SUPPLY VOLTAGE FALLS BELOW A PREDETERMINED THRESHOLD

FIELD

The invention relates to a circuit and method for monitoring a supply voltage and providing an indication when the supply voltage falls below a predetermined threshold. The invention more particularly relates to a circuit and method that use an adaptive refresh of capacitors to provide such monitoring.

BACKGROUND

Within integrated circuits it is important for the operation of circuit components that the supply voltage (Vdd) is accurately known and more importantly that the supply voltage is not allowed to fall below a predetermined threshold without some action been taken. Known solutions include providing circuits that compare the supply voltage directly with a reference voltage and provide as an output an indication when the two diverge by a predetermined factor. This indication can be used to reset other components within the integrated circuit chip or indeed to cause some other remedial action.

Problems with such known monitoring circuits include the fact that the monitoring circuit requires a constant monitoring of both the reference voltage (Vref) and the supply voltage (Vdd). This can result in the monitoring circuit having high power requirements. As a solution to this problem it is known to couple the supply voltage to a resistor divider string which provides a voltage to a capacitor, the stored capacitor providing an output which, although decaying according to the characteristics of the capacitor, is indicative of the supply voltage. By refreshing the capacitor at a periodic rate which is less than the decay value it is possible to reduce the power requirements of the circuit without reducing the monitoring performance. However such solutions still suffer in that the refresh is effected regardless of whether the refresh is required, therefore resulting in a turning on of the resistor divider network irrespective of whether it is required. Such indiscriminate coupling of the capacitor to the resistor string results in power being consumed.

There is therefore a need to provide an improved monitoring circuit and method that can provide an indication when the supply voltage falls below a predetermined threshold value yet does not have the same power requirements as the known solutions.

SUMMARY

These and other problems are addressed by a monitoring circuit in accordance with the present invention. In a first embodiment a capacitor is used to provide a voltage indicative of the supply voltage being monitored. The capacitor is charged by switchably coupling the capacitor to a resistor divider network and refreshing that capacitor on demand as opposed to at a fixed periodic rate. By reducing the refresh rate it is possible to reduce the power requirements of the circuit, yet still achieves the result of ensuring that if the supply voltage falls below a predetermined value that some action may be taken.

According to a first embodiment, a monitoring circuit according to claim 1 is provided. Such a circuit includes a first capacitor that is switchably coupled to a resistor divider network and stores a charge that is indicative of the charge voltage from the node on the network to which it is coupled. The output of this first capacitor is compared against the output of a second capacitor that stores a charge a charge that is indicative of a voltage reference. Each of the first and second capacitors decay according to defined decay characteristics and require periodic refreshing. This embodiment provides this refresh based on a detection that the output from the first capacitor is not greater than the output from the second capacitor. By providing such an adaptive refresh the invention provides for a reduction in the periodic rate at which the refresh is required—it is refreshed on demand as opposed to at a fixed periodic rate independent of the output of the capacitors.

A monitoring circuit according to claim 16 is also provided in accordance with a second embodiment.

Another embodiment provides a method of monitoring a supply voltage according to claim 32. A further method is provided in claim 35.

These and other features of the invention will be better understood with reference to the non-limiting exemplary embodiments which will be described below with reference to the following drawings.

BRIEF DESCRIPTION OF THE DRAWINGS

FIG. 5 is an example of a timing sequence associated with various components of the circuit of FIG. 3 when the supply voltage drops below its rated value.

DETAILED DESCRIPTION

The invention will now be described with regard to exemplary embodiments thereof as illustrated in FIGS. 1 to 8 of the accompanying drawings.

Figure 1:
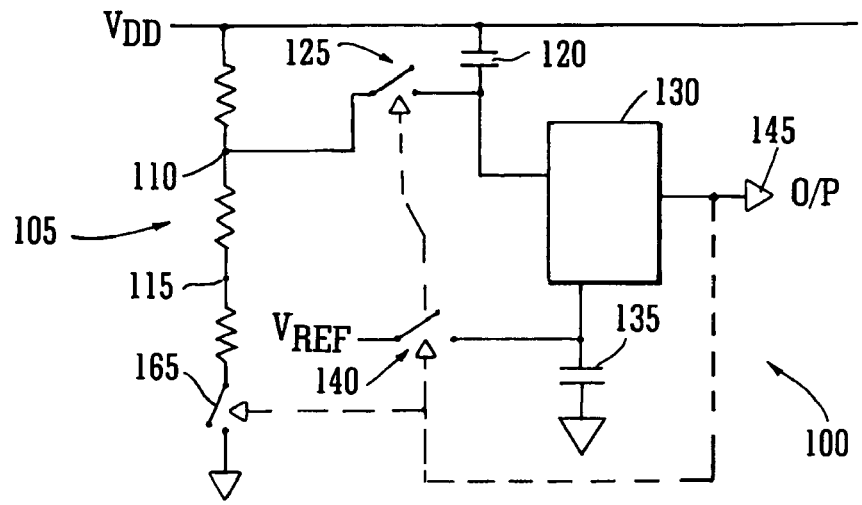
FIG. 1 is a block schematic showing a circuit in accordance with the teaching of the invention.

As shown in FIG. 1, in accordance with the teachings of the invention a monitoring circuit 100 is provided which includes a resistor divider string 105 that is coupled to a supply voltage Vdd. In this embodiment a switch 165 is provided between on the resistor divider such that its connection with the ground reference may be broken so as to reduce the power drawdown from the supply voltage. The voltage across the resistor divider is indicative of the output of the supply voltage and will change with changes in the supply voltage. It will be appreciated that the voltage sensed at a first node 110 will be different to that sensed at a second node 115, but that both will change proportionally to the other with fluctuations in the supply voltage. A first capacitor 120 is coupled to the first node 110 of the resistor divider by means of a switch 125. In this way when the switch is turned on, the capacitor will charge (i.e. be refreshed) and when the switch is turned off the capacitor will decay or leak at a rate that is determined by the capacitor and or switch characteristics—as will be appreciated by those skilled in the art. The output of the first capacitor 120 is compared using a comparator function block 130 against the output of a second capacitor 135 which is shown in FIG. 1 as being coupled via a switch 140 to a reference voltage Vref. Initially, the output value of the first capacitor is greater than that of the second capacitor.

Once the comparator senses that the output of the first capacitor is equal to the output of the second capacitor it effects a switching of the resistor network to recharge the first capacitor. This switching action actuates both the resistor divider switch 165 and the switch 125. In this way the resistor divider is only turned on when required, thereby reducing the power requirements of the circuit. Ideally if the supply voltage Vdd is at its original level, the recharging of the first capacitor will result in a reversion to the initial condition that the output of the first capacitor is greater than that of the second capacitor. If the value of Vdd has dropped, then the refresh of the second capacitor will be to a lower value than that originally provided. In certain circumstances this value will still be greater than that of output of the second capacitor. However, if the supply voltage Vdd has dropped considerably then there is a possibility that even after a re-charge of the first capacitor that its output will be less than the output of the second capacitor, i.e. there is a condition present within the circuit that indicates that the supply voltage Vdd has dropped below a predetermined minimum value and some remedial action is required.

To test for this condition, the falling of the supply voltage below the predetermined reference value, the comparator block is configured such that on sensing that the output of the first capacitor is less than the reference voltage it provides a signal at an output 145 that may be used to reset other circuit blocks or provide some other remedial action as will be appreciated by those skilled in the art. Ideally, the comparator block functions in two steps. In a first step, a comparison of the outputs of the first and second capacitors is made and on sensing that the output value of the first is no longer greater than that of the second capacitor effecting a recharge of the first capacitor. In a second step, which is conducted subsequent to the recharge, the comparator blocks further tests the output of the first capacitor against that of the second and on sensing that its output is still not greater than that of the second capacitor provides an output signal indicative of the fact that the supply voltage has dropped below a minimum predetermined value.

Figure 2:
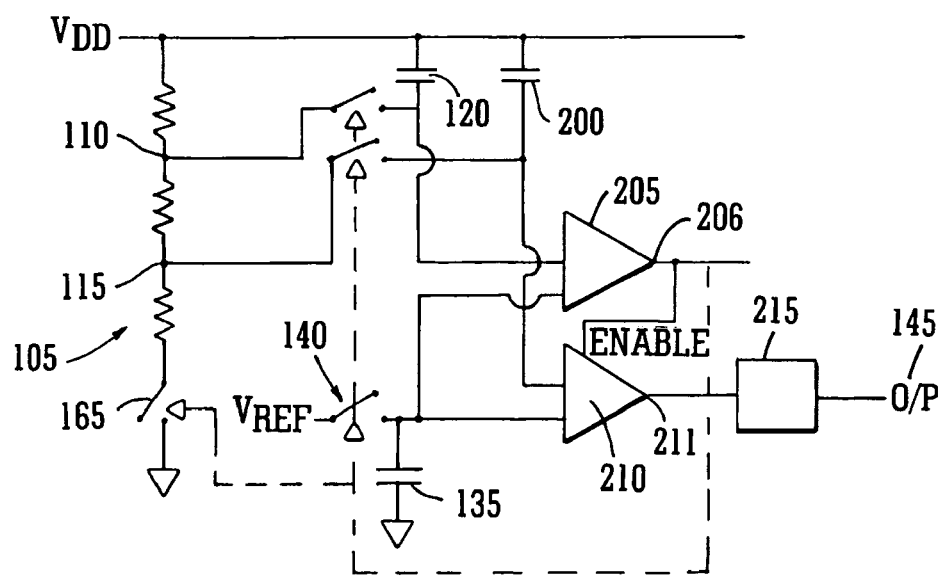
FIG. 2 is shows in more detail some of the components that may be utilised in the circuit of FIG. 1.

FIG. 2 shows a modification to the circuit of FIG. 1 where a second resistor divider capacitor 200 is provided. This capacitor is also coupled to the resistor divider, albeit at a different node 115 on the string. Detail of an example of the type of circuit that may be provided within the comparator block is also shown, in this example first 205 and second 210 comparators are provided. Each comparator has a first and second input and an output. The first comparator 205 is coupled to the voltage reference capacitor 135 and to the first resistor divider capacitor 120 and is configured to effect a refresh of the first 120 and second 200 resistor divider capacitors once equivalence between the voltage reference capacitor 135 and first resistor divider capacitor 120 is sensed. The output 206 of the first comparator 205 is also used to control, or enable, the activation of the second comparator 210, such that the second comparator 210 is only turned on once there is a requirement for it. The first comparator is always on, always sensing the values of the outputs of the first capacitor 120 and the voltage reference capacitor 135.

The output 211 of the second comparator 210 is coupled to the output 145 of the monitoring circuit via a delay element 215. The inputs of the second comparator 210 are coupled to the output of the second resistor divider capacitor 200 and to the voltage reference capacitor 135. The delay element is preferably configured to effect an immediate output change when the output of the second resistor divider capacitor (which is directly related to the voltage at the node 115 to which it is coupled) falls below the reference voltage but allows a time delay when sensing that the voltage is greater than the reference voltage.

By configuring the two comparators in this fashion it is possible to ensure that the output 145 of the circuit is not switched too early. The operation of the first comparator refreshes the resistor divider network based on sensed inputs related to the voltage reference and its convergence with the voltage indicative of the output of a first node of the resistor divider network. The node selected comparison by this first comparator is desirably at a lower potential than the node selected for comparison with Vref by the second comparator. This then serves as an early warning indicator of fluctuations in Vdd, which are then confirmed by the second comparator when it is enabled. In this fashion, the two tap points 110, 115 used on the resistor divider network 105 can be considered as an early warning tap point 110 (used by the first comparator) and an accurate tap point 115 (used by the second comparator).

Figure 3:
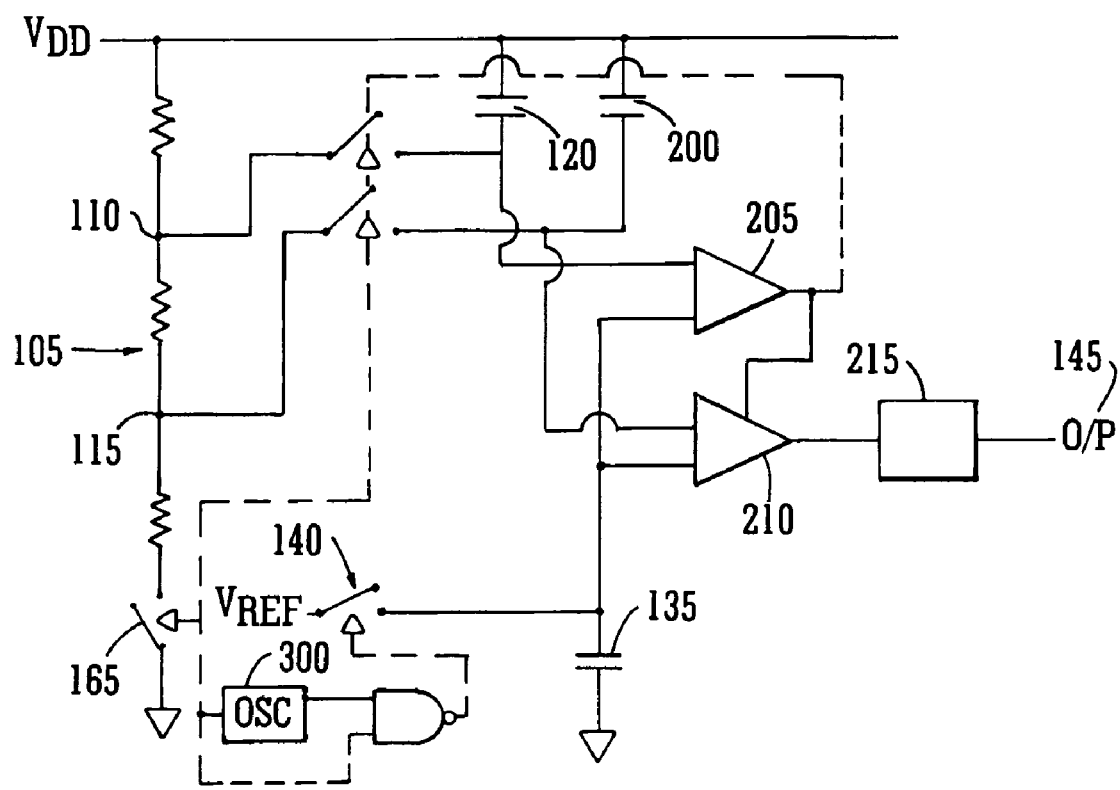
FIG. 3 is a schematic of components in accordance with a preferred implementation of the invention.
Figure 4A:
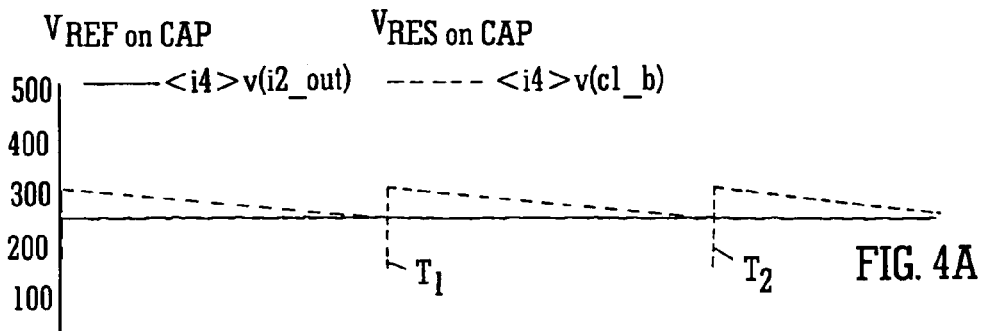
FIG. 4 is an example of a timing sequence associated with various components of the circuit of FIG. 3 during constant behaviour of the supply voltage.
Figure 4B:
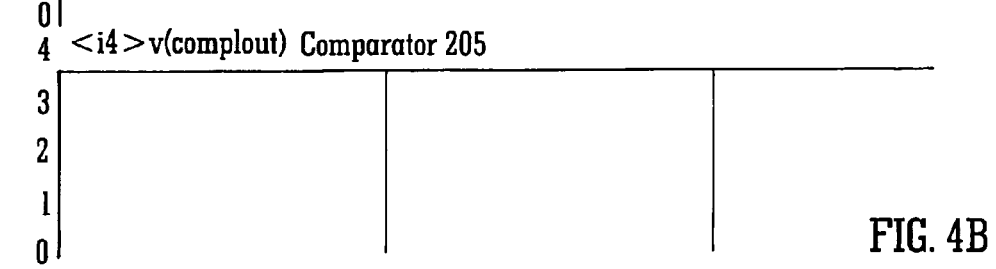
Figure 4C:
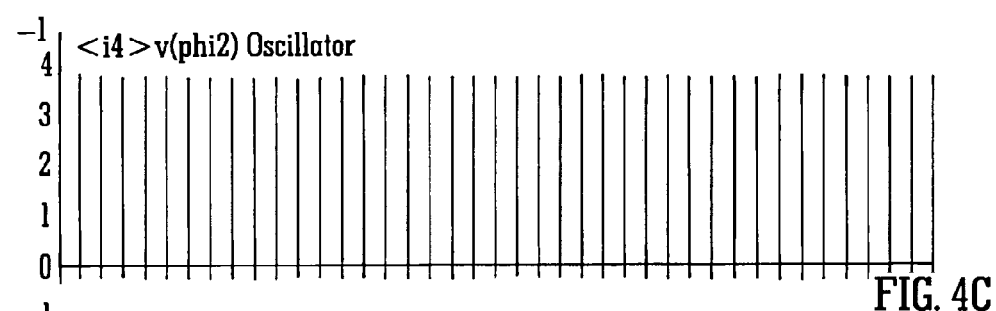
Figure 4D:
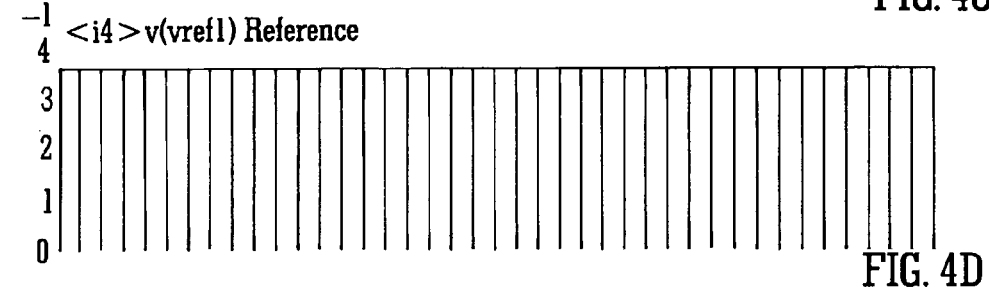
Figure 4E:
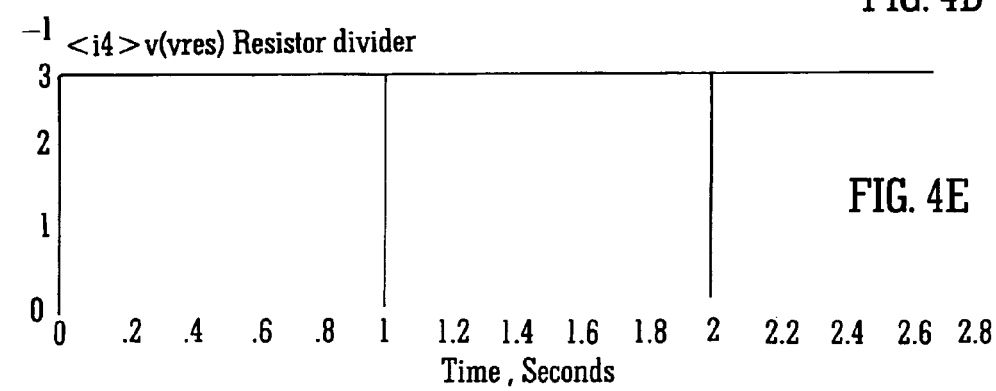

FIG. 3 shows a modification to the circuit of FIG. 2 where the reference capacitor 135 is also coupled to an oscillator 300 which serves to refresh the reference capacitor at a fixed periodic rate, irrespective of whether the first comparator has ascertained that a change is required. In this way it will be appreciated that the reference capacitor is refreshed as a result of two inputs; the first being the refreshing of all capacitors by the output of the first comparator and the second being a periodic refreshing effected by the operation of the oscillator. By providing this fixed periodic refresh of the reference capacitor 135 it is possible to ensure that the output of this capacitor never falls below a value less than the predetermined minimum against which the supply voltage Vdd is compared.

FIG. 4 shows an example of the timing diagrams that are associated with operation of the circuit of FIG. 3. As will be seen from portion A, which shows the output of the first capacitor converging towards a periodically refreshed reference capacitor, at some point in time, T1, the two are equal. This equality is sensed by the first comparator, shown in portion 4B, whose output switches, causing the resistor divider, portion E, to also switch. The switching of the resistor divider causes the first capacitor 120 to recharge, and also causes the reference capacitor 135 to recharge. This recharging is superimposed on the regular recharging of the reference capacitor, portion D, that is also resultant from the cycles of the oscillator, portion C. This repetition would continue indefinitely (see similar reaction at time T2) until some glitch in the output of the supply voltage Vdd is sensed.

An example of the reaction of the circuit of FIG. 3 to such a glitch is shown in FIG. 5. As shown in portion A, at time T1, Vdd falls from its normal 3.05V output to about 2.95V. As a result when the first capacitor 120 recharges, it cannot charge to its full capacity but only to a value related to the reduced Vdd value. As a result the inputs sensed by the first comparator indicate that voltage of the reference capacitor is greater than the voltage of the resistor divider capacitor (portion B). The comparator therefore having switched to turn on the resistor divider network does not switch again, therefore keeping the resistor divider network on (portions C & F). The oscillator output (portion D) is also forced high until such time as the reference voltage is less than or equal to the voltage indicative of the voltage on the resistor divider. The reference capacitor is not refreshed during this time (portion E). In this reset mode of the circuit all switches are closed and all capacitors are maintained in their fully charged condition. This mode therefore corresponds to a maximum power consumption mode of operation. Once the reference capacitor 135 has an output less than or equal to the output of the first capacitor—thereby indicative that the supply voltage Vdd has risen again to its normal condition, the switches that couple the capacitors to their respective charging nodes can open again. When all switches are open it will be appreciated that the circuit is operating in its minimum power consumption mode.

Figure 6:
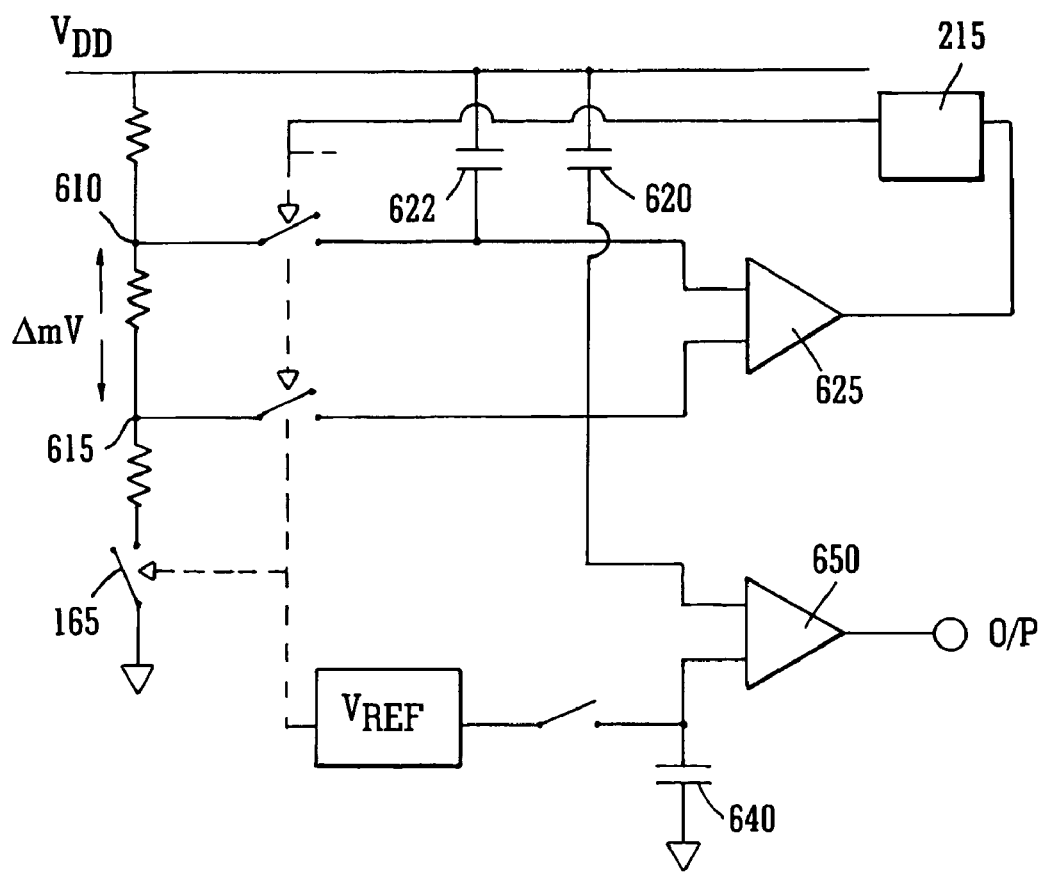
FIG. 6 is a schematic of components in accordance with a second preferred embodiment of the invention.
Figure 7:
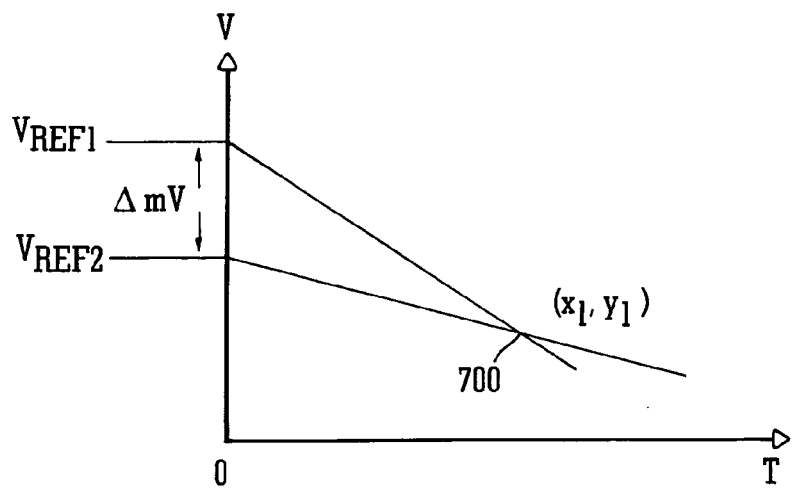
FIG. 7 is a graph showing convergence of the outputs of first and second resistor divider capacitors of FIG. 6.

FIG. 6 shows an example of a circuit 600 in accordance with a second embodiment of the invention, again using adaptive control of capacitors to provide monitoring of a supply voltage Vdd in a power efficient manner. In this embodiment a voltage divider 605 is also provided, the voltage divider providing a plurality of nodes 610, 615 each of which are switchably coupled to a respective capacitor 620, 622 and are also coupled to respective inputs of a comparator 625. The voltage stored on each capacitor is therefore indicative of the voltage present on the node that that capacitor is coupled to. As each node is separated by at least one resistor, it will be appreciated that these two voltage will vary according to the value of the resistive difference between the two, irrespective of the fact that the resistor divider is coupled to Vdd. By judiciously choosing each capacitor to have a different decay constant, and as each capacitor initially stores a different voltage to the other, at some predetermined point in time (related to the initial charge stored on each capacitor and its respective decay rate) the voltages sensed by the comparator will eventually converge. An example of the type of voltage drop off that may be expected in accordance with this embodiment is shown in FIG. 7. On sensing that the two voltages are equal, the comparator switches thereby causing a refresh of the two capacitors. In this way, it will be appreciated that the refresh frequency is adjusted depending on the ambient and process conditions and not as a result of a fixed period refresh sequence.

The switching of the comparator also causes a switching of a reference capacitor 640 which is coupled to an input of a second comparator 650. It is important that the refresh rate caused by the first comparator is less than the decay rate of the reference capacitor. In this way the reference capacitor is not discharged below a level where the required tolerances of the application would be compromised prior to being refreshed. By refreshing the reference capacitor using the first comparator it will be appreciated that the requirement for the oscillator that was present in FIG. 3 is obviated, therefore saving both area on the chip but also reducing further the power requirements of the circuit.

The second comparator 650 takes as a second input a signal coupled from one of the two resistor divider capacitors, preferably that coupled to the higher potential node 610. The second comparator compares the values of the reference voltage capacitor and the resistor divider capacitor and effects a switch in its output on sensing that the two are equal. This second comparator (differently to the operation of the comparators shown in FIG. 3) is not activated by the first comparator but remains on continuously.

Figure 8:
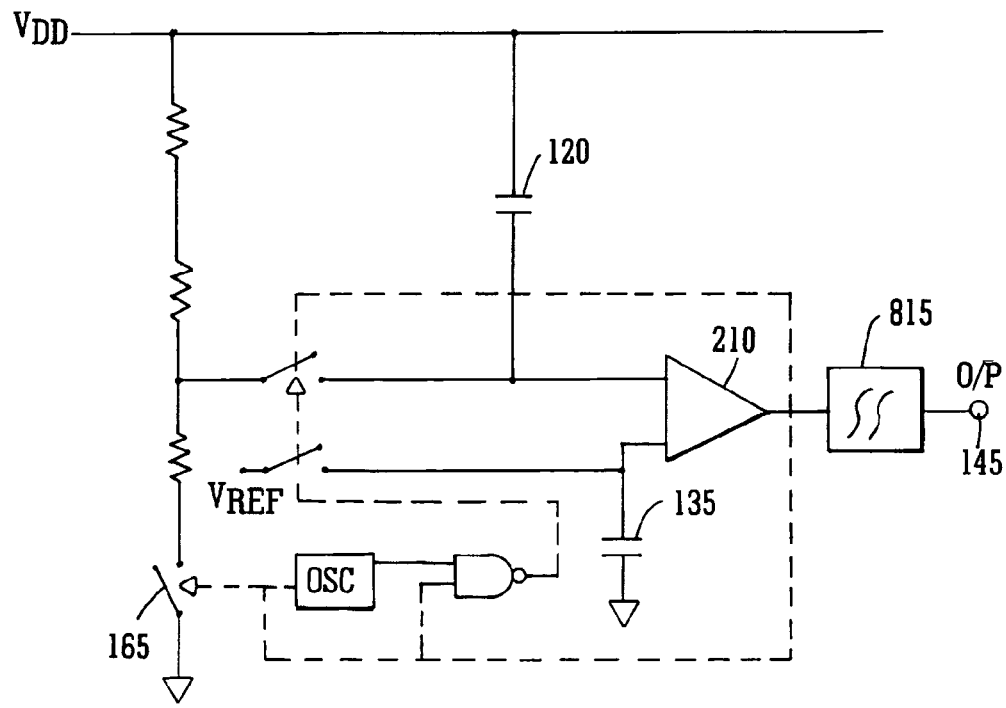
FIG. 8 is a schematic of components in accordance with a third preferred embodiment.

It will be appreciated that what has been described herein is a monitoring circuit that operates by refreshing sensing capacitors at a rate that is dependent on their operation as opposed to at a fixed periodic rate. In this way the time that power is consumed by activation of the resistor divider string is minimised. The provision of a first comparator to determine when the refresh is to be effected—either by comparing one of the resistor divider capacitors with another of the restive divider capacitors or with a capacitor having a voltage reflective of a reference voltage, provides for an internal adaptive clocking of the switching mechanism, which ensures that the power on time of the circuit is minimised. The provision of a second comparator which compares the reference voltage with a voltage taken from a capacitor coupled to a resistor divider may be used to determine a switching at the output node of the circuit. This second comparator provides as an output a signal that is indicative of whether the supply voltage has fallen below a predetermined value, and this can then be used to assert for example a reset signal for a microprocessor circuit coupled to the monitoring circuit. The switching functionality of the second comparator heretofore described can be provided by the output of the first comparator which will therefore obviate the need for the second comparator. An example of how this can be achieved is shown in FIG. 8 where the output of the first comparator is compared to a first and second delay element 815, albeit shown in FIG. 8 as a single unit. The first delay element will serve to provide a delay on a falling edge before effecting a switching and the second delay element will serve to provide a delay on the rising edge between sensing a voltage step and effecting a switching at the output. It will therefore be understood that the circuit operates based on a sensing that the reference capacitor voltage and the resistor divider capacitor voltage are equal, such a sensing effecting a switching of the comparator. This will immediately cause the resistor divider to turn on which will refresh the resistor divider capacitor. If after a certain time, which should allow the capacitor to be refreshed, the comparator output to revert to its normal position then a reset signal is issued.

It will be understood that what has been described herein are exemplary embodiments of a monitoring circuit which provides for a monitoring of the supply voltage in a power efficient manner. By using capacitors whose outputs are related to the value of the supply voltage and sensing these as opposed to the supply voltage directly, it is possible to monitor the supply voltage without continuously drawing power from the supply line. An adaptive refresh of the capacitors is provided whereby they are recharged on demand as opposed to at a fixed periodic rate irrespective of need. Once the output of the capacitors is not greater than the output of a test value for a predetermined time period the monitoring circuit is configured to provide an output indicating that the supply line voltage has dropped and action needs to be taken.

Although the invention has been described with reference to preferred embodiments, parameters and performance values, it will be understood that it is not intended that the invention be limited in any way except as may be deemed necessary in the light of the appended claims. It will be also understood that although specific features of the invention are shown in some drawings and not others, this is for convenience only as each feature may be combined with any or all of the other features in accordance with the invention.

Furthermore, unless the context clearly requires otherwise, throughout the description and the claims, the words 'comprise', 'comprising', and the like are to be construed in an inclusive sense, as opposed to an exclusive or exhaustive sense; that is to say, in the sense of "including, but not limited to".

The invention claimed is:

1. A power supply monitoring circuit configured to provide at an output thereof a signal indicative of whether the power supply output has fallen below a predetermined threshold, the circuit including:
   a. A resistor divider network string coupled to the power supply,
   b. A first resistor divider capacitor switchably coupled to a first node of the resistor divider network, the first capacitor storing a charge indicative of the voltage at said first node,
   c. A voltage reference capacitor switchably coupled to a reference voltage, the reference capacitor storing a charge indicative of the voltage provided by the reference voltage,
   d. A comparator module coupled to each of the capacitors and being operable to control a switch for selectively coupling the first resistor divider capacitor to the resistor divider network for refreshing the first resistor divider capacitor on detecting that the output voltage of the first resistor divider capacitor is not greater than the output voltage of the reference capacitor and further configured to provide at an output thereof a signal indicative that the supply voltage is less than a predetermined value on detecting that the value of the reference capacitor output voltage continues to be greater than the value of the first resistor divider capacitor output voltage subsequent to refreshing the value of the first resistor divider capacitor output voltage.

2. The circuit of claim 1 wherein the comparator module includes a first comparator and a second comparator, the first comparator being operable to control the switch to selectively couple the first capacitor to the resistor divider network for refreshing thereof and the second comparator being operable to provide the signal indicative that the supply voltage is less than a predetermined value.

3. The circuit as claimed in claim 2 further including a second resistor divider capacitor, the second resistor divider capacitor being switchably coupled to a second node of the resistor divider network.

4. The circuit as claimed in claim 3 wherein the first comparator is coupled to the second capacitor and the reference capacitor and the second comparator is coupled to the first capacitor and the reference capacitor.

5. The circuit as claimed in claim 4 wherein the first and second capacitors are of the same type.

6. The circuit as claimed in claim 4 wherein the first capacitor is coupled to the first node of the resistor divider network providing a higher charge to the first capacitor than the second node of the resistor divider network to which the second capacitor is coupled provides to the second capacitor.

7. The circuit as claimed in claim 1 wherein the comparator module controls the switch to selectively couple the reference capacitor to the resistor divider network for refreshing thereof when the values of the output voltages of the first resistor divider capacitor and the reference capacitor are equal.

8. The circuit as claimed in claim 7 wherein the reference capacitor is further coupled to an oscillator, the oscillator providing a periodic refresh of the reference capacitor at a rate that is greater than the refresh resulting from the switch coupling the reference capacitor to the resistor divider network.

9. The circuit as claimed in claim 2 further including a delay element provided at the output of the second comparator, the delay element providing a delay in switching the output of the circuit to a high output, the delay element providing no delay in switching the output of the circuit to a low output.

10. The circuit as claimed in claim 3 wherein the first comparator is coupled to each of the first and second resistor divider capacitors and the second comparator is coupled to a selected one of the resistor divider capacitors and the reference capacitor.

11. The circuit as claimed in claim 10 wherein each of the first and second resistor divider capacitors are provided with different decay characteristics to that of the other.

12. The circuit as claimed in claim 11 wherein the first comparator is operable to control a switch to selectively couple the first and second resistor divider capacitors to the resistor divider network for refreshing thereof on determining that the output voltages of each of the first and second resistor divider capacitors are equal.

13. The circuit as claimed in claim 12 wherein the first comparator is operable to control a switch to selectively couple the reference capacitor to the resistor divider network for refreshing said capacitor on determining that the output voltages of each of the first and second resistor divider capacitors are equal.

14. The circuit as claimed in claim 13 wherein the decay characteristics of the reference capacitor are such that the reference capacitor decays at a rate that is less than the least of the decay rates of the first and second resistor divider capacitors.

15. The circuit as claimed in claim 1 wherein the resistor divider network string is coupled to ground via a switch, the comparator module being operable to selectively control the switch provided between the first resistor divider capacitor and the resistor divider network string and the switch coupled between the resistor divider network string and ground on detecting that the output voltage of the first resistor divider capacitor is not greater than the output voltage of the reference capacitor.

16. A monitoring circuit configured to provide an output signal on effecting a measurement that is indicative that a supply voltage has fallen below a predetermined minimum value, the circuit including:
   a. A resistor string coupled to the supply voltage,
   b. A capacitor coupled via a switch to a node on the string, the capacitor being charged by closing the switch and providing an output voltage indicative of the voltage at that node,
   c. A comparator module being operable to compare the output voltage of the capacitor to that of a reference voltage derived from a voltage reference and to control the switch for selectively coupling the capacitor to the resistor string for refreshing thereof on determining that the reference voltage is at least equal to the output voltage of the capacitor.

17. The circuit as claimed in claim 16 wherein the comparator module is operable to perform a second comparison of the output voltage of the capacitor with that of the reference voltage in response to the capacitor being refreshed and to provide a signal at the output of the monitoring circuit that the supply voltage has fallen below the predetermined value on sensing during this second comparison that the reference voltage is greater than the output voltage of the capacitor.

18. The circuit as claimed in claim 16 wherein the capacitor is a first capacitor of the circuit and the reference voltage is provided by a second capacitor coupled to the voltage reference.

19. The circuit as claimed in claim 18 wherein the second capacitor is coupled to the voltage reference via a switch.

20. The circuit as claimed in claim 19 wherein the second capacitor is refreshed by closing the second capacitor switch which is selectively controlled by the comparator module, thereby coupling the second capacitor to the voltage reference.

21. The circuit as claimed in claim 20 wherein the periodicity at which the second capacitor is refreshed is greater than that at which the first capacitor is refreshed.

22. The circuit as claimed in claim 20 further comprising a third capacitor, the third capacitor being coupled via a switch to a second node on the string, the third capacitor being charged by closing the switch between the third capacitor and the second node which is controlled by the comparator module and providing an output voltage indicative of the voltage at that second node.

23. The circuit as claimed in claim 22 wherein the comparator module includes a first comparator operable to perform a comparison between the output voltage of the first capacitor and the reference voltage and a second comparator operable to perform a comparison between the output voltage of the third capacitor and the reference voltage.

24. The circuit as claimed in claim 23 wherein the first comparator is operably coupled to the second comparator for facilitating enabling thereof; and the second comparator is enabled on determination by the first comparator that the reference voltage is greater than the output voltage of the first capacitor.

25. The circuit as claimed in claim 24 wherein the second comparator is operable, on being enabled, to provide a signal at the output of the monitoring circuit that the supply voltage has fallen below the predetermined value on sensing that the reference voltage is greater than the output voltage of the second capacitor.

26. The circuit as claimed in claim 22 wherein the comparator module includes a first comparator operable to perform a comparison between the output of the first capacitor and the third capacitor value and a second comparator operable to perform a comparison between the output voltage of the second capacitor and an output voltage of a selected one of the first and third capacitors.

27. The circuit as claimed in claim 26 wherein each of the first and third capacitors are characterized by different decay characteristics to that of the other.

28. The circuit as claimed in claim 27 wherein the first comparator controls the switch to selectively couple the first and third capacitors to the resistor divider network for refreshing thereof on determining that the output voltages of each of the first and second resistor divider capacitors are equal.

29. The circuit as claimed in claim 28 wherein the first comparator further controls the switch to selectively couple the second capacitor to the resistor divider network for refreshing thereof on determining that the output voltages of each of the first and third capacitors are equal.

30. The circuit as claimed in claim 29 wherein the decay characteristics of the second capacitor are such that the second capacitor decays at a rate that is less than the least of the decay rates of the first and third capacitors.

31. The circuit as claimed in claim 16 wherein the comparator controls the switch to selectively couple the capacitor to the resistor divider network for refreshing thereof on determining that the reference voltage is greater than that of the output voltages of the capacitor.

32. A method of providing an indication that a supply voltage is below a predetermined minimum value, the method comprising the steps of:
   a. Providing a resistor divider network string, the network string being coupled to the supply voltage and having a plurality of nodes defined thereon, each of the plurality of nodes having an associated voltage value defined by the resistance between that node and the supply voltage,
   b. Switchably coupling a first capacitor to a node of the resistor divider network, the first capacitor storing a charge indicative of the voltage at that node,
   c. Switchably coupling a second capacitor to a reference voltage, the second capacitor storing a charge indicative of the voltage provided by the reference voltage,
   d. Comparing the output voltages of the first and second capacitors and controlling a switch to selectively couple the first capacitor to the resistor divider network for refreshing thereof on detecting that the output voltage of the second capacitor is at least equal to the output voltage of the first capacitor, and
   e. Providing a signal indicative that the supply voltage is less than a predetermined value on detecting that the output voltage of the second capacitor continues to be at least equal to the output voltage of the first capacitor subsequent to refreshing the first capacitor.

33. The method as claimed in claim 32 wherein the refreshing of step d) is provided on determining that the output voltage of the second capacitor is greater than the output voltage of the first capacitor.

34. The method as claimed in claim 33 wherein the signal provided in step e) is provided on detecting that the output voltage of the second capacitor continues to be greater than the output voltage of the first capacitor.

35. A method of monitoring a supply voltage for fluctuations on an output of a source of the supply voltage, the method including the steps of:
   a. Providing one or more capacitors whose outputs are related to a value of the supply voltage, the one or more capacitors being coupled via a switch to a resistor string which is in turn coupled to the supply voltage,
   b. Monitoring the outputs of the one or more capacitors, so as to monitor the supply voltage without continuously drawing power from the supply voltage source,
   c. Selectively refreshing the one or more capacitors by controlling the switch to selectively couple the one or more capacitors to the resistor string thereby providing an on-demand recharge and,
   d. On sensing that the output of the one or more capacitors is less than the output of a reference value derived from a reference voltage for a predetermined time period, providing an output signal indicative that the supply line voltage has dropped and action needs to be taken.

* * * * *